US010961944B2

(12) United States Patent
Fukuda

(10) Patent No.: US 10,961,944 B2
(45) Date of Patent: Mar. 30, 2021

(54) FUEL INJECTION CONTROL DEVICE

(71) Applicant: HITACHI AUTOMOTIVE SYSTEMS, LTD., Hitachinaka (JP)

(72) Inventor: Takao Fukuda, Ibaraki (JP)

(73) Assignee: HITACHI AUTOMOTIVE SYSTEMS, LTD., Hitachinaka (JP)

(*) Notice: Subject to any disclaimer, the term of this patent is extended or adjusted under 35 U.S.C. 154(b) by 249 days.

(21) Appl. No.: 15/570,483

(22) PCT Filed: Jun. 1, 2016

(86) PCT No.: PCT/JP2016/066090
§ 371 (c)(1),
(2) Date: Oct. 30, 2017

(87) PCT Pub. No.: WO2016/208334
PCT Pub. Date: Dec. 29, 2016

(65) Prior Publication Data
US 2018/0142643 A1 May 24, 2018

(30) Foreign Application Priority Data
Jun. 24, 2015 (JP) .............................. JP2015-127015

(51) Int. Cl.
F02D 41/34 (2006.01)
F02D 41/20 (2006.01)
(Continued)

(52) U.S. Cl.
CPC ........... F02D 41/345 (2013.01); F02D 41/20 (2013.01); F02D 41/34 (2013.01); F02D 45/00 (2013.01);
(Continued)

(58) Field of Classification Search
CPC ........ F02D 41/345; F02D 41/20; F02D 45/00; F02D 2041/2013; F02M 61/1893; H03M 1/68
(Continued)

(56) References Cited

U.S. PATENT DOCUMENTS 3,835,819 A * 9/1974 Anderson, Jr. ..... F02D 41/2416
123/406.47
4,106,448 A * 8/1978 Noguchi ................. F02D 41/24
123/268
(Continued)

FOREIGN PATENT DOCUMENTS

DE 102 06 953 A1 2/2003
DE 10 2007 045992 A1 4/2009
(Continued)

OTHER PUBLICATIONS

International Search Report with English translation and Written Opinion issued in application No. PCT/JP2016/006090 dated Sep. 13, 2016.
(Continued)

Primary Examiner — David Hamoui
Assistant Examiner — John D Bailey
(74) Attorney, Agent, or Firm — Foley & Lardner LLP

(57) ABSTRACT

Provided is a fuel injection control device capable of improving detection accuracy of a singular point with respect to a characteristic of the fuel injection valve to be equal to or higher than an original time resolution of the A/D conversion, and capable of accurately detecting the singular point. A variable control part 24 variably controls a conversion timing of the A/D conversion part 221 such that the conversion timing of A/D conversion for physical quantity data related to driving of the fuel injection valve 10 is relatively changed, the A/D conversion part 221 acquires a
(Continued)

plurality of time series data by performing A/D conversion on the physical quantity data at a conversion timing before change and at a conversion timing after change by the variable control part 24, and a detection part 223 detects a singular point with respect to the characteristic of the fuel injection valve 10 based on the plurality of time series data.

7 Claims, 6 Drawing Sheets

(51) Int. Cl.
 *F02D 45/00* (2006.01)
 *F02M 61/18* (2006.01)
 *H03M 1/68* (2006.01)
 *H03M 1/66* (2006.01)
(52) U.S. Cl.
 CPC .......... *F02M 61/1893* (2013.01); *H03M 1/66* (2013.01); *H03M 1/68* (2013.01); *F02D 2041/2013* (2013.01); *F02D 2041/2055* (2013.01); *F02D 2250/14* (2013.01); *Y02T 10/40* (2013.01)
(58) Field of Classification Search
 USPC ........................................................ 123/490
 See application file for complete search history.

(56) References Cited

U.S. PATENT DOCUMENTS

| | | | | |
|---|---|---|---|---|
| 4,812,768 | A * | 3/1989 | Quinn | F02P 17/00 324/379 |
| 4,849,744 | A * | 7/1989 | Putrow | F02P 17/00 345/10 |
| 4,977,876 | A * | 12/1990 | Nanyoshi | F02D 41/126 123/333 |
| 4,980,845 | A * | 12/1990 | Putrow | F02P 17/00 701/102 |
| 5,604,500 | A * | 2/1997 | Murakami | H03M 1/08 341/118 |
| 6,473,286 | B1 * | 10/2002 | Itabashi | F02D 41/20 123/490 |
| 6,535,811 | B1 * | 3/2003 | Rowland | F02D 41/2422 701/115 |
| 6,832,601 | B2 * | 12/2004 | Watanabe | F02D 41/20 123/480 |
| 7,552,709 | B2 * | 6/2009 | Fujii | F02D 41/2438 123/299 |
| 7,578,279 | B2 * | 8/2009 | Ehresman | F02M 51/0603 123/297 |
| 2003/0015173 | A1 * | 1/2003 | Yokoyama | F02D 11/10 123/350 |
| 2003/0195692 | A1 * | 10/2003 | Stevens | F02D 41/28 701/104 |
| 2004/0149644 | A1 * | 8/2004 | Partridge | F02M 37/0064 210/321.6 |
| 2005/0066940 | A1 * | 3/2005 | Sheikh | F02D 41/406 123/446 |
| 2006/0060168 | A1 | 3/2006 | Watanabe et al. | |
| 2007/0137621 | A1 * | 6/2007 | Kimura | F02P 3/0876 123/490 |
| 2011/0153182 | A1 * | 6/2011 | Sasaki | F02D 35/027 701/111 |
| 2014/0020661 | A1 * | 1/2014 | Nishimura | F02D 41/3005 123/480 |
| 2014/0034025 | A1 * | 2/2014 | Nishimura | F02M 69/04 123/478 |
| 2014/0067233 | A1 * | 3/2014 | Nishida | F02D 41/28 701/103 |
| 2015/0128913 | A1 * | 5/2015 | Parisi | F02D 41/20 123/490 |
| 2015/0275815 | A1 * | 10/2015 | Shibata | F02D 41/20 123/490 |
| 2016/0076498 | A1 | 3/2016 | Aono et al. | |
| 2016/0102628 | A1 * | 4/2016 | Denk | F02D 41/20 701/105 |
| 2016/0177855 | A1 * | 6/2016 | Kusakabe | F02M 65/005 123/490 |
| 2016/0237937 | A1 * | 8/2016 | Kusakabe | F02D 41/402 |
| 2017/0058815 | A1 * | 3/2017 | Tan | F02D 41/20 |
| 2017/0138292 | A1 * | 5/2017 | Schweikert | F02D 41/20 |
| 2017/0218876 | A1 * | 8/2017 | Kusakabe | F02D 41/32 |
| 2018/0058363 | A1 * | 3/2018 | Otsuji | F02D 41/2467 |
| 2018/0066597 | A1 * | 3/2018 | Fukuzumi | F02D 41/20 |

FOREIGN PATENT DOCUMENTS

| | | |
|---|---|---|
| DE | 10 2011 005773 A1 | 1/2012 |
| JP | 2002-039001 A | 2/2002 |
| JP | 2003-028001 A | 1/2003 |
| JP | 2006-090188 A | 4/2006 |
| JP | 2008-278304 A | 11/2008 |
| JP | 2013-011231 A | 1/2013 |
| WO | WO-2014/174916 A1 | 10/2014 |

OTHER PUBLICATIONS

Extended European Search Report dated Dec. 11, 2018 in European Application No. 16814105.9.

* cited by examiner

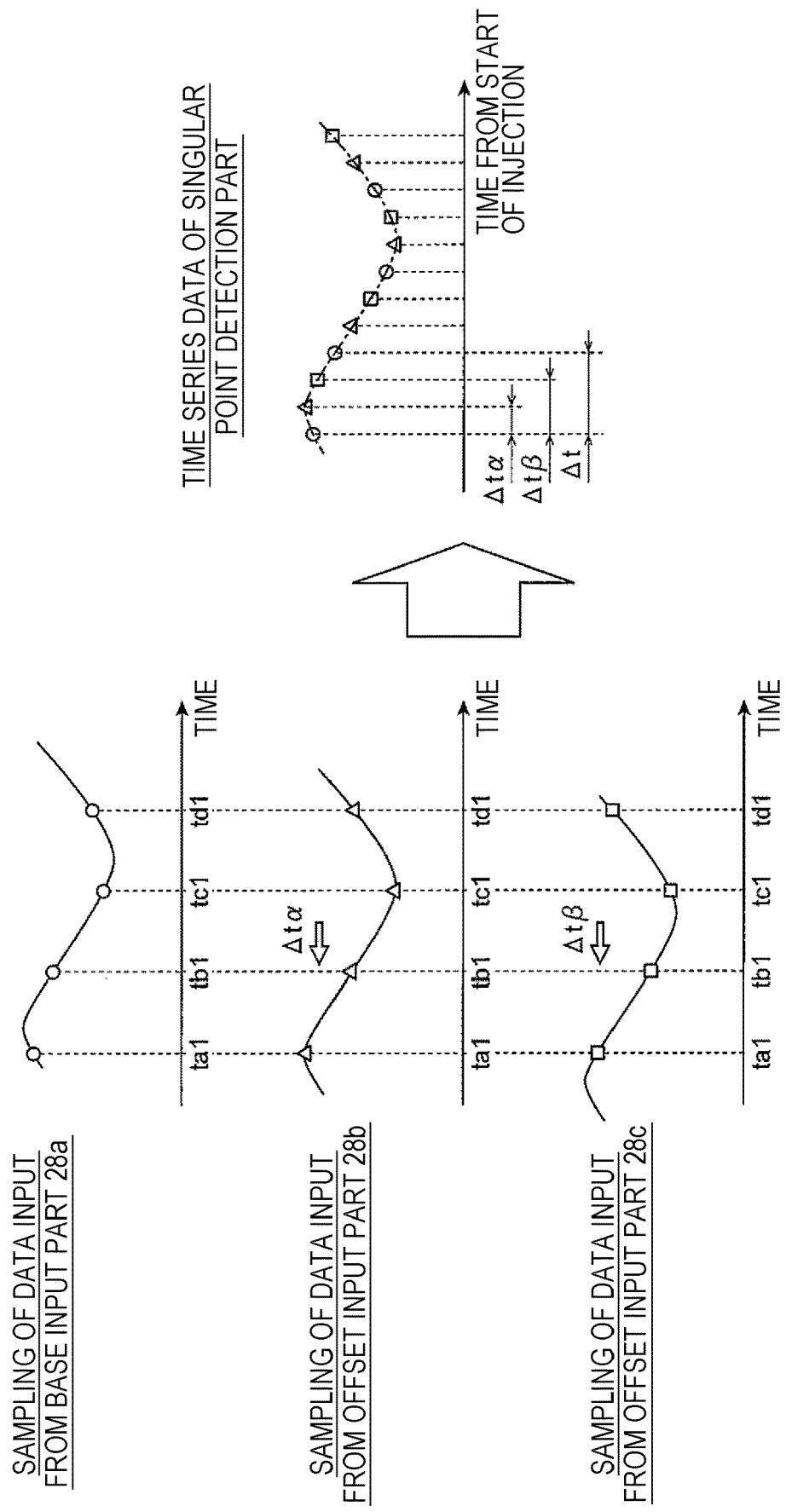

FUEL INJECTION CONTROL DEVICE

TECHNICAL FIELD

The present invention relates to a fuel injection control device, for example, a fuel injection control device that suppresses instrumental variations among fuel injection valves provided in an internal combustion engine, by precisely detecting injection characteristics of the fuel injection valves.

BACKGROUND ART

Conventionally, as a fuel injection technology of an internal combustion engine, a technology of directly injecting (supplying) fuel into a cylinder has been practically used.

Additionally, in recent years, from the requirement for further cleaning of exhaust gas and improvement of fuel consumption and output or the like, a fuel injection quantity per cycle has been reduced by splitting the fuel required for one combustion stroke into a plurality of times to inject (multi-stage injection), and downsizing has been promoted by combining an internal combustion engine with a supercharger to reduce a displacement. Therefore, in order to cope with a minimum output to a maximum output of the internal combustion engine, there is a demand for further expansion of a dynamic range from a minimum injection amount (minimum flow rate) to a maximum injection amount (maximum flow rate) of a flow characteristic of the fuel injection valve.

In order to expand the dynamic range of the flow characteristic of such a fuel injection valve, for example, it is necessary to increase the maximum injection amount by such as enlarging a hole diameter of the fuel injection valve, or to open a valve element of the fuel injection valve only for a very short time in a region of the minimum injection amount, causing necessity of using a so-called intermediate lift state in which the valve element is closed before being fully opened.

It is known that, when fuel is injected from a plurality of fuel injection valves provided in an internal combustion engine into a cylinder of the internal combustion engine, even if each fuel injection valve is driven by a same injection pulse (driving pulse for controlling opening and closing of the fuel injection valve), movement of a valve element of each fuel injection valve changes based on a spring characteristic, a solenoid characteristic, or the like of each fuel injection valve, and a valve opening start timing and a valve closing completion timing of each fuel injection valve, a time width from a start of valve opening to a completion of valve closing, or the like vary, this causes the fuel injection quantity of each fuel injection valve to vary for each individual. Further, a variation amount of the fuel injection quantity does not change so much even if the fuel injection quantity of each fuel injection valve changes. Therefore, when the fuel injection quantity per cycle is reduced by multi-stage injection as described above, for example, a ratio of the variation amount to the fuel injection quantity per one cycle becomes relatively large, the fuel injection quantity injected on one combustion stroke greatly deviates from the target fuel injection quantity, and the variation amount of the fuel injection quantity of each fuel injection valve tends to be further increased.

For this reason, a technology for detecting the injection characteristic of each fuel injection valve has been conventionally adopted to an internal combustion engine in which a plurality of fuel injection valves are disposed, as described in PTL 1, for example, in order to control the fuel injection quantity of each fuel injection valve by changing the injection pulse of each fuel injection valve according to the injection characteristic of each fuel injection valve.

The related art disclosed in PTL 1 is a technology for causing an A/D converter to perform A/D conversion on a fuel pressure signal at every fixed time that is very short such as tracing a waveform, and reading each A/D conversion value to detect an injection characteristic of an injector (fuel injection valve) in consideration of an operation state received from an engine ECU, based on time series of the A/D conversion value (i.e., a detected value of the fuel pressure).

CITATION LIST

Patent Literature

PTL 1: JP 2013-011231 A

SUMMARY OF INVENTION

Technical Problem

In order to precisely detect the injection characteristic of each fuel injection valve and suppress instrumental variations among individual fuel injection valves provided in the internal combustion engine, for example, it is required to improve a time resolution of A/D conversion to accurately detect a singular point with respect to the characteristic of the fuel injection valve from the time-series A/D conversion value. However, since the A/D conversion by the A/D converter is normally scheduled regularly in synchronization with a peripheral clock, and the A/D conversion is performed at constant time intervals, the detection accuracy of the singular point described above cannot be improved to be equal to or higher than the time resolution of the A/D conversion at present. In addition, since the A/D conversion is performed by sampling at a same timing every time (same timing as a driving timing of the fuel injection valve), it is difficult to accurately detect the singular point from this point as well.

The present invention has been made in view of the above problems, and it is an object of the present invention to provide a fuel injection control device, with a simple configuration, capable of improving detection accuracy of a singular point with respect to a characteristic of the fuel injection valve to be equal to or higher than an original time resolution of the A/D conversion, and capable of accurately detecting the singular point.

Solution to Problem

In order to solve the above problem, a fuel injection control device according to the present invention is a fuel injection control device that controls behavior of a fuel injection valve by detecting an injection characteristic of the fuel injection valve from physical quantity data relating to driving of the fuel injection valve. The fuel injection control device includes: an input part to input the physical quantity data; an A/D conversion part that performs A/D conversion on the physical quantity data at a conversion timing having a predetermined time interval to acquire time series data; a detection part that detects a singular point with respect to a characteristic of the fuel injection valve from the time series data; and a variable control part that variably controls an input timing of the input part or a conversion timing of the A/D conversion part such that the conversion timing for the physical quantity data is relatively changed. In the fuel injection control device, the A/D conversion part acquires a plurality of time series data by performing, at the conversion timing, A/D conversion on a plurality of physical quantity data input at an input timing before change and an input timing after change by the variable control part, or by performing A/D conversion on the physical quantity data at a conversion timing before change and at a conversion timing after change by the variable control part, and the detection part detects the singular point based on the plurality of time series data.

Advantageous Effects of Invention

According to the present invention, the variable control part variably controls the input timing of the input part or the conversion timing of the A/D conversion part such that the conversion timing for the physical quantity data relating to driving of the fuel injection valve is relatively changed, the A/D conversion part acquires the plurality of time series data by performing, at the conversion timing, A/D conversion on the plurality of physical quantity data input at the input timing before change and at the input timing after change, or by performing A/D conversion on the physical quantity data at the conversion timing before change and at the conversion timing after change, and the detection part detects the singular point with respect to the characteristic of the fuel injection valve, based on the plurality of time series data. This allows improvement of detection accuracy of the singular point with respect to the characteristic of the fuel injection valve to be equal to or higher than the original time resolution of the A/D conversion, and allows accurate detection of the singular point, enabling reliable suppression of instrumental variations among the fuel injection valves provided in the internal combustion engine.

The problems, configurations, and effects other than those described above will be clarified by the description of the embodiments below.

BRIEF DESCRIPTION OF DRAWINGS

FIG. 6 is an explanatory chart describing A/D conversion by an A/D converter shown in FIG. 5.

DESCRIPTION OF EMBODIMENTS

Hereinafter, embodiments of an internal combustion injection control device according to the present invention will be described with reference to the drawings.

First Embodiment

Figure 1:
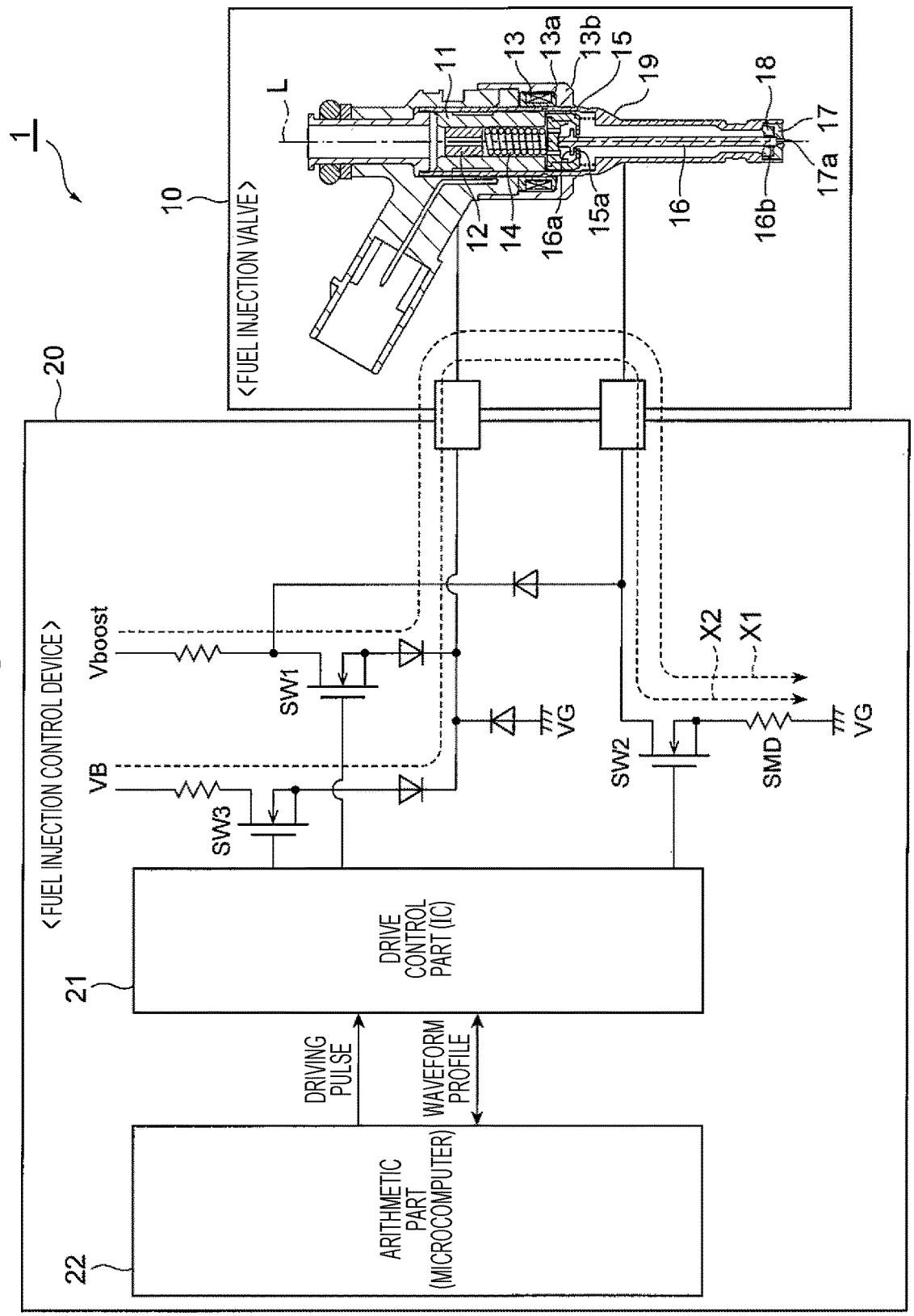
FIG. 1 is an overall configuration diagram showing a schematic configuration of a fuel injection device applied with a first embodiment of a fuel injection control device according to the present invention.

FIG. 1 shows a schematic configuration of a fuel injection device applied with a first embodiment of a fuel injection control device according to the present invention.

A fuel injection device 1 of the illustrated embodiment is mainly configured by an electromagnetic fuel injection valve 10 and a fuel injection control device 20, and the fuel injection control device 20 has a drive control part 21 configured by an IC, and an arithmetic part 22 configured by a microcomputer.

Although the fuel injection valve 10 applied to the fuel injection device 1 is not limited to the illustrated example, the fuel injection valve 10 shown in FIG. 1 basically includes: a cylindrical body 19; a cylindrical fixed core 11 fixedly arranged inside the cylindrical body 19; a solenoid 13 wound around a bobbin 13a arranged outside the fixed core 11 via the cylindrical body 19; a movable element 15 disposed to be relatively movable in a direction of the axis L with respect to the cylindrical body 19 below the fixed core 11; a valve element 16 that relatively moves in the direction of the axis L with respect to the cylindrical body 19 in accordance with the movement of the movable element 15; and a valve seat 17 disposed at a lower end of the cylindrical body 19 and having a valve hole (fuel injection hole) 17a that is opened and closed in accordance with the movement of the valve element 16. Further, an adjusting element 12 is press-fitted into the fixed core 11, and a set spring 14 that urges the movable element 15 toward the valve seat 17 is disposed between the adjusting element 12 and the movable element 15. The solenoid 13 is accommodated in a housing 13b disposed outside the cylindrical body 19.

A through hole is formed at a lower end of the movable element 15, and an upper end of the valve element 16 is inserted into the through hole. The valve element 16 is supported so as to be moved in the direction of the axis L by a movable element guide 15a formed by a peripheral portion of the through hole of the movable element 15, and a guide member 18 arranged above the valve seat 17. Further, above the movable element guide 15a on the upper end of the valve element 16, there is formed a protrusion 16a having a relatively larger outer shape than the through hole of the movable element 15. Therefore, when the movable element 15 moves upward, the protrusion 16a of the valve element 16 is contacted with the movable element guide 15a forming the through hole of the movable element 15, to cause the movable element 15 and the valve element 16 to be integrally moved upward.

When the solenoid 13 of the fuel injection valve 10 is not energized, the movable element 15 is urged toward the valve seat 17 by an urging force of the set spring 14, and a lower end 16b of the valve element 16 abuts with the valve seat 17 to close the valve hole 17a. In a state where the solenoid 13 is energized, a magnetic attractive force for attracting the movable element 15 to the fixed core 11 is generated, and when the magnetic attractive force overcomes the urging force of the set spring 14, the movable element 15 is attracted toward the fixed core 11 until colliding with the fixed core 11, and the lower end 16b of the valve element 16 separates from the valve seat 17 in accordance with the movement of the movable element 15, to open the valve hole 17a. When the energization to the solenoid 13 is interrupted, the magnetic attraction force for attracting the movable element 15 to the fixed core 11 disappears, the movable element 15 is urged toward the valve seat 17 by the urging force of the set spring 14, and the lower end 16b of the valve element 16 is pushed back to the valve seat 17 to close the valve hole 17a.

The arithmetic part 22 of the fuel injection control device 20 calculates a time and a time width of the time at which fuel is injected from the valve hole 17a of the fuel injection valve 10 into the cylinder of the internal combustion engine, based on various information such as an engine speed, an intake air amount, and temperature, to output a driving pulse and a waveform profile (also referred to as a drive mode) for controlling opening and closing of the fuel injection valve 10, to the drive control part 21.

The drive control part 21 boosts a battery voltage VB to several tens of volts to generate a boosted voltage Vboost, causes switching of switches SW1, SW2, and SW3, which are between the solenoid 13 of the fuel injection valve 10 and the battery voltage VB, the boosted voltage Vboost, and a ground voltage VG, based on the information output from the arithmetic part 22, and controls the driving voltage applied to the solenoid 13 of the fuel injection valve 10 to control the driving current applied to the solenoid 13. Thus, changing the energization state of the solenoid 13 in accordance with the driving voltage applied by the drive control part 21 allows control of opening and closing of the valve hole 17a of the fuel injection valve 10, and control of a quantity of fuel injected from the valve hole 17a (fuel injection quantity).

Next, referring to FIG. 2, the driving pulse output from the arithmetic part 22, the driving voltage and the driving current applied to the solenoid 13 of the fuel injection valve 10, a lift quantity (displacement amount) of the valve element 16 that are described above, will be described in more detail. The driving voltage may be measured by a voltage between two points sandwiching the solenoid 13 of the fuel injection valve 10, may be measured by a voltage between the ground voltage VG and a voltage on a side applied with the battery voltage VB or the boosted voltage Vboost, and may be measured by a voltage between a ground side (LowSide terminal) of the solenoid 13 and the ground voltage VG (see FIG. 3). Further, the driving current can be measured from a voltage applied to a shunt resistance SMD by interposing the shunt resistance SMD between the ground side of the solenoid 13 and the ground voltage VG (see FIG. 3).

Figure 2:
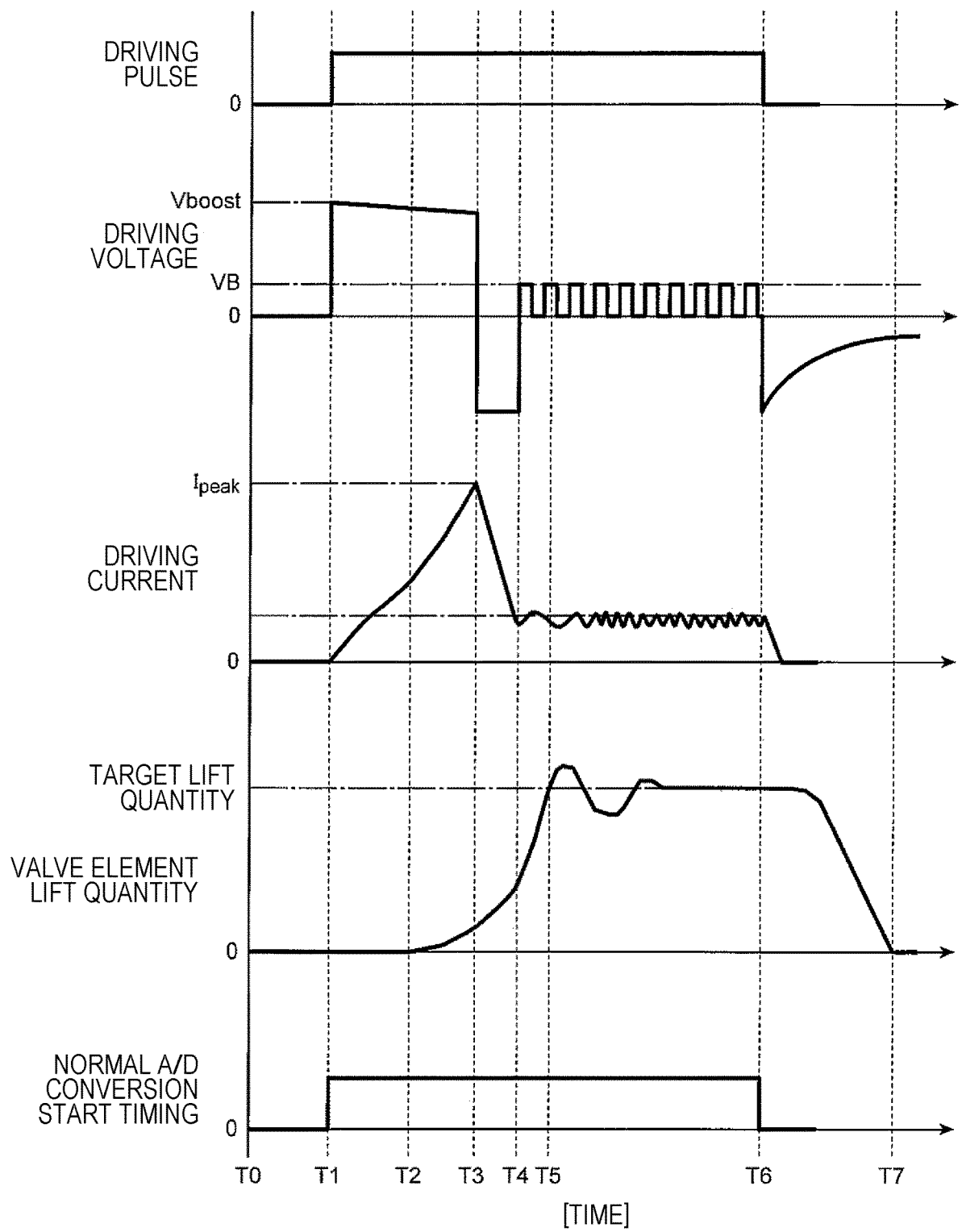
FIG. 2 is a timing chart showing an example of a time series of a driving pulse, a driving voltage, a driving current, a lift quantity of a valve element, and an A/D conversion start timing by an A/D converter when fuel is injected from the fuel injection valve shown in FIG. 1.

As shown in FIG. 2, at time T0 to T1, the driving pulse output from the arithmetic part 22 is in an OFF state, switches SW1, SW2, and SW3 are all in an OFF state, and the driving current is not supplied to the solenoid 13 of the fuel injection valve 10. Therefore, the movable element 15 and the valve element 16 of the fuel injection valve 10 are urged in the valve closing direction of the valve seat 17 by the urging force of the set spring 14, and the lower end 16b of the valve element 16 is in close contact with the valve seat 17 to close the valve hole 17a.

At time T1, when the driving pulse is turned ON, switches SW1 and SW2 are turned ON, and the boosted voltage Vboost, the solenoid 13, and the ground voltage VG are conducted through (the driving voltage of the solenoid 13 is Vboost) to supply the driving current to the solenoid 13 (a current flow indicated by arrow X1 in FIG. 1), magnetic flux passes between the fixed core 11 and the movable element 15 to cause a magnetic attractive force to act on the movable element 15. When the driving current supplied to the solenoid 13 is increased, and the magnetic attractive force acting on the movable element 15 exceeds the urging force of the set spring 14, the movable element 15 is attracted toward a direction of the fixed core 11 and starts to move (time T1 to T2). When the movable element 15 moves by a predetermined length (the length for abutting the movable element guide 15a of the movable element 15 with the protrusion 16a of the valve element 16), the movable element 15 and the valve element 16 integrally starts moving in the direction of axis L (time T2). Then, the lower end 16b of the valve element 16 separates from the valve seat 17 to open the valve hole 17a, and fuel is injected from the valve hole 17a.

Although the movable element 15 and the valve element 16 integrally move until the movable element 16 collides with the fixed core 11, the movable element 15 is bounded on the fixed core 11 when the movable element 16 and the fixed core 11 collide strongly, disturbing the flow rate of the fuel injected from the valve hole 17a. Therefore, at time T3 before the movable element 15 collides with the fixed core 11, switches SW1 and SW2 are turned off, the driving voltage applied to the solenoid 13 is decreased, and the driving current is decreased from a peak value $I_{peak}$, to reduce power of the movable element 15 and the valve element 16.

Since only sufficient magnetic attraction force is supplied to attract the valve element 16 and the movable element 15 toward the fixed core 11 from time T4 until time T6 when the driving pulse falls, switch SW3 is intermittently turned on (PMW control on switch SW3) while switch SW2 is kept in the ON state, the driving voltage applied to the solenoid 13 is intermittently set to the battery voltage VB, and the driving current flowing through the solenoid 13 is controlled to fall within a predetermined range (a current flow indicated by arrow X2 in FIG. 1). At time T5, the movable element 15 collides with the fixed core 11, and the valve element 16 is displaced to a target lift quantity.

At time T6, when the driving pulse is turned off, switches SW1, SW2, and SW3 are all turned off, the driving voltage of the solenoid 13 is decreased, and the driving current flowing through the solenoid 13 is decreased, the magnetic flux generated between the fixed core 11 and the movable element 15 gradually disappears, the magnetic attraction force acting on the movable element 15 disappears, and the valve element 16 is pushed back in the valve closing direction of the valve seat 17 with a predetermined time delay due to the urging force of the set spring 14 and the pressing force of the fuel pressure. Then, at time T7, the valve element 16 is returned to its original position, the lower end 16b of the valve element 16 closely contacts the valve seat 17 to close the valve hole 17a, and fuel is not injected from the valve hole 17a.

In order to suppress variation in the fuel injection quantity according to the injection characteristic based on the spring characteristic, the solenoid characteristic, and the like of the fuel injection valve 10, and to bring the fuel injection quantity of the fuel injection valve 10 close to a target fuel injection quantity, the arithmetic part 22 described above monitors the driving voltage applied to the solenoid 13 and the driving current supplied to the solenoid 13, detects opening and closing of (the valve hole 7a of) the fuel injection valve 10 (e.g., the valve opening start time T2 and the valve closing completion time T7, in particular) driven by the driving pulse and the waveform profile output from the arithmetic part 22, and detects the injection characteristic during fuel injection of the fuel injection valve 10 and feeds back the detection result to generate a more appropriate driving pulse and waveform profile.

Hereinafter, referring to FIGS. 3 and 4, there will be described in detail a method of detecting the injection characteristic of the fuel injection valve 10 by the arithmetic part 22, more specifically, a method of detecting a singular point (minimum point, maximum point, inflection point, or the like) relating to driving of the fuel injection valve 10 based on a driving voltage or time series data of the driving voltage.

Figure 3:
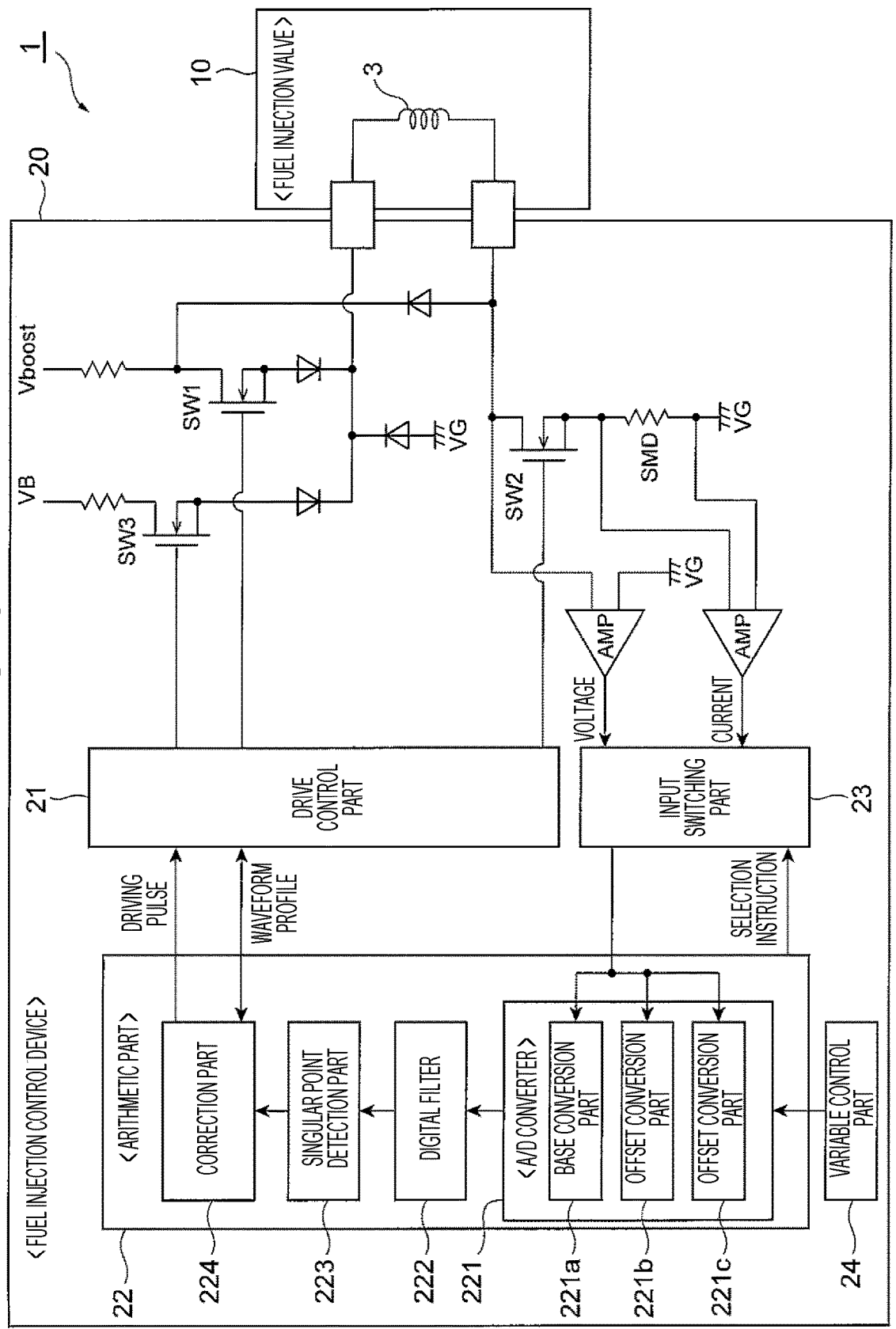
FIG. 3 is an internal configuration diagram showing an internal configuration of the fuel injection control device shown in FIG. 1.
Figure 4:
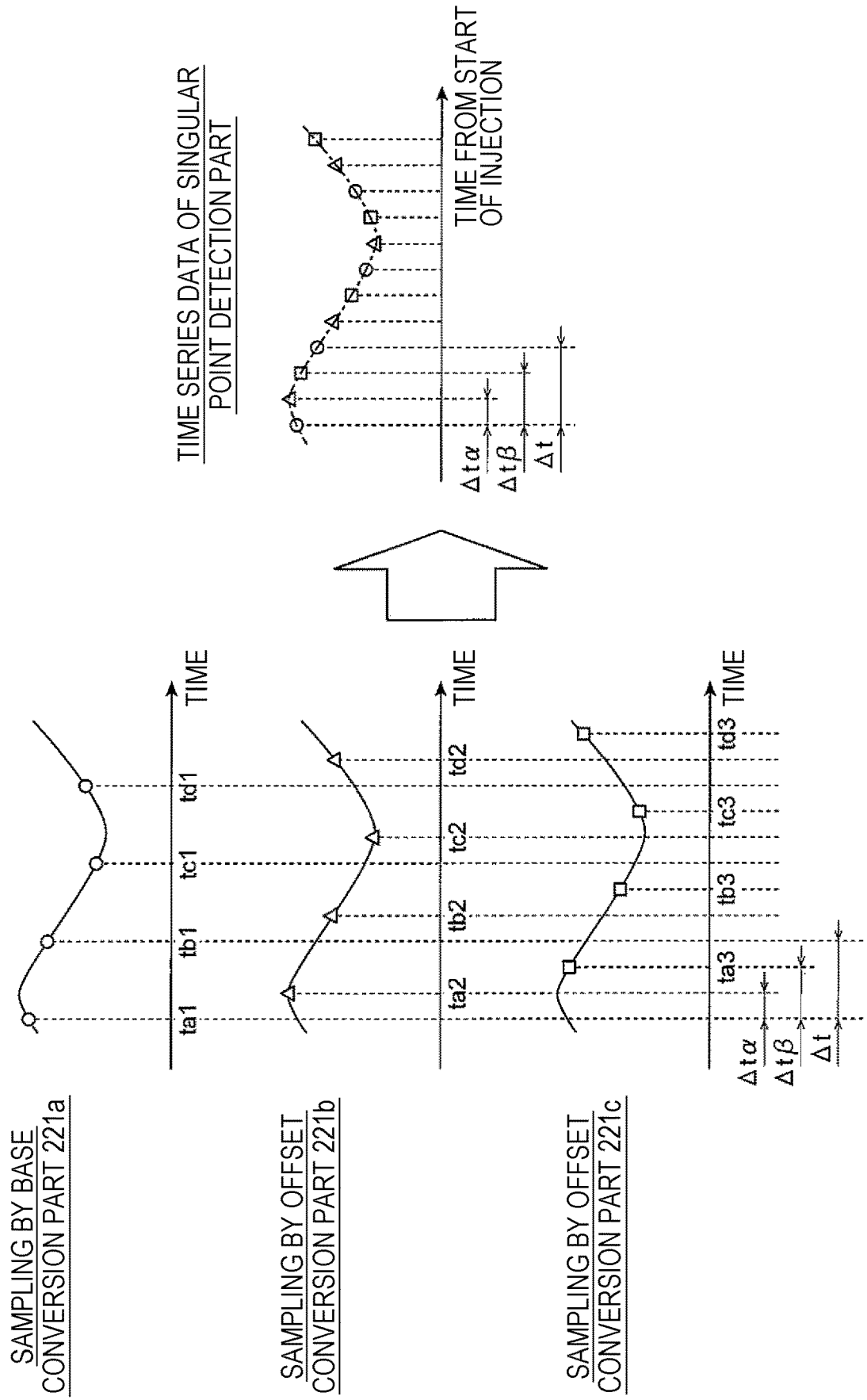
FIG. 4 is an explanatory chart describing A/D conversion by an A/D converter shown in FIG. 3.

FIG. 3 shows an internal configuration of the fuel injection control device shown in FIG. 1, and FIG. 4 specifically describes the A/D conversion by the A/D converter shown in FIG. 3.

As shown in FIG. 3, the fuel injection control device 20 of the present embodiment has the drive control part 21 and the arithmetic part 22 described above, and has an input switching part (input part) 23 and a variable control part 24. Further, the arithmetic part 22 mainly includes an A/D converter (A/D conversion part) 221, a digital filter 222, a singular point detection part (detection part) 223, and a correction part 224. As described above, individual parts such as the drive control part 21, the arithmetic part 22, the input switching part 23, and the like share a clock, that is, the clock of each part is synchronized with a drive timing of the fuel injection valve 10.

The input switching part 23 selects the driving voltage to be applied to the solenoid 13 or the driving current to be supplied to the solenoid 13 based on a selection instruction output from the arithmetic part 22, and inputs to the A/D converter 221 of the arithmetic part 22. The arithmetic part 22 outputs the selection instruction to the input switching part 23, for selecting the driving current to input to the A/D converter 221 when detecting a singular point at or near the valve opening start time, for example, and for selecting the driving voltage to input to the A/D converter 221, when detecting a singular point at or near the valve closing completion time.

The A/D converter 221 of the arithmetic part 22 samples and A/D-converts the time series data of the driving voltage or the driving current input from the input switching part 23 (hereinafter also referred to as physical quantity data relating to driving of the fuel injection valve 10, or simply as physical quantity data) at a conversion timing having a predetermined time period and a predetermined time interval ($\Delta t$), and outputs a digitized conversion result to the singular point detection part 223 via the digital filter 222.

Here, the A/D conversion by the A/D converter 221 is normally scheduled regularly in synchronization with a peripheral clock of the drive control part 21, the input switching part 23, or the like (see FIG. 2), and A/D conversion is performed at constant time intervals (periods). Therefore, in the present embodiment, in order to accurately detect the singular point, in other words, in order to increase the detection accuracy of the singular point to be equal to or higher than the original time resolution of the A/D conversion, there is provided the variable control part 24 that outputs a command signal for changing the conversion timing of the A/D conversion for the physical quantity data, to the A/D converter 221.

In detail, the A/D converter 221 has a base conversion part 221a that starts A/D conversion at a reference conversion start timing synchronized with the peripheral clock of the drive control part 21, the input switching part 23, or the like (i.e., synchronized with driving of the fuel injection valve 10), and offset conversion parts 221b and 221c that start A/D conversion at an offset conversion start timing where the reference conversion start timing is shifted (delayed, in the example) by a time shorter than the predetermined time interval ($\Delta t$), and the quantity data is input from the input switching part 23 to each of the base conversion part 221a and the offset conversion parts 221b and 221c via different channels. In the illustrated example, two types of the offset conversion parts are set, and the offset amount $\Delta t\alpha$ and $\Delta t\beta$ at the conversion start timing in each of the offset conversion parts 221b and 221c (i.e., the offset amount at the conversion timing of the A/D conversion in the offset conversion parts 221b and 221c with respect to the conversion timing of the A/D conversion in the base conversion part 221a) have a relationship of $\Delta t\alpha < \Delta t\beta < \Delta t$. However, a setting number of the offset conversion part can be optionally changed according to the detection accuracy (i.e., the resolution) of the singular point.

The A/D converter 221 in the arithmetic part 22 normally A/D-converts the physical quantity data in the base conversion part 221a. However, when receiving the command signal output from the variable control part 24, the A/D converter 221 activates the offset conversion parts 221b and 221c, and A/D-converts the physical quantity data in the offset conversion parts 221b and 221c in addition to the base conversion part 221a. As a result, the base conversion part 221a obtains time series data sampled at the conversion timing (reference conversion timing) having the predetermined time interval ($\Delta t$), the offset conversion part 221b obtains time series data sampled at a time shifted by Ata from the reference conversion timing, and the offset conversion part 221c obtains time series data sampled at a time shifted by $\Delta t\beta$ from the reference conversion timing (see FIG. 4).

The A/D converter 221 outputs the time series data acquired by each of the base conversion part 221a and the offset conversion parts 221b and 221c (a plurality of (three types in the illustrated example) time series data having different conversion timings for the physical quantity data) to the singular point detection part 223 via the digital filter 222, and the singular point detection part 223 superimposes (adds) the plurality of time series data to detect a singular point, and outputs the detection result to the correction part 224. As a method of detecting the singular point by the singular point detection part 223, a conventionally known appropriate numerical calculation method (e.g., averaging processing or the like) can be applied.

Then, the correction part 224 feeds back the detection result output from the singular point detection part 223, to the driving pulse and the waveform profile already obtained, to generate a more appropriate driving pulse and waveform profile. This makes it possible to generate a driving pulse and a waveform profile according to the injection characteristic of each fuel injection valve, and to properly control opening and closing of the fuel injection valve to bring the fuel injection quantity injected from the fuel injection valve close to the target fuel injection quantity.

As described above, in the fuel injection control device 20 of the present embodiment, the variable control part 24 variably controls the conversion timing of the A/D converter 221 such that the conversion timing for the physical quantity data related to driving of the fuel injection valve 10 is relatively changed, the A/D converter 221 acquires a plurality of time series data by performing A/D conversion on the physical quantity data input from the input switching part 23 in synchronization with driving of the fuel injection valve 10 at the conversion timing before change and at the conversion timing after change, and the singular point detection part 223 detects the singular point with respect to the characteristic of the fuel injection valve 10 based on the plurality of time series data. This allows improvement of detection accuracy of the singular point with respect to the characteristic of the fuel injection valve 10 to be equal to or higher than the original time resolution of the A/D conversion, and allows accurate detection of the singular point, enabling reliable suppression of instrumental variations among the fuel injection valves 10 provided in the internal combustion engine.

In the above-described embodiment, a configuration has been described where the variable control part 24 variably controls the conversion timing (specifically, the conversion start timing) of the A/D converter 221 such that the conversion timing for the physical quantity data during one fuel injection by the fuel injection valve 10 is relatively changed. On the other hand, the variable control part 24 may receive a drive signal of the fuel injection valve 10 (i.e., a signal related to fuel injection by the fuel injection valve 10) from the drive control part 21, to control the conversion timing (specifically, the conversion start timing) of the A/D converter 221 such that the conversion timing for the physical quantity data is changed at every fuel injection in response to (in synchronization with) fuel injection by the fuel injection valve 10. That is, the variable control part 24 may output a command signal for sequentially activating one of the base conversion part 221a and the offset conversion parts 221b and 221c, to the A/D converter 221, in response to fuel injection by the fuel injection valve 10, the A/D converter 221 may acquire time series data with a shifted (offset) conversion timing for the physical quantity data at every fuel injection of the fuel injection valve 10, and the singular point detection part 223 may accumulate the time series data and then superimpose the plurality of accumulated time series data to detect the singular point.

Second Embodiment

Figure 5:
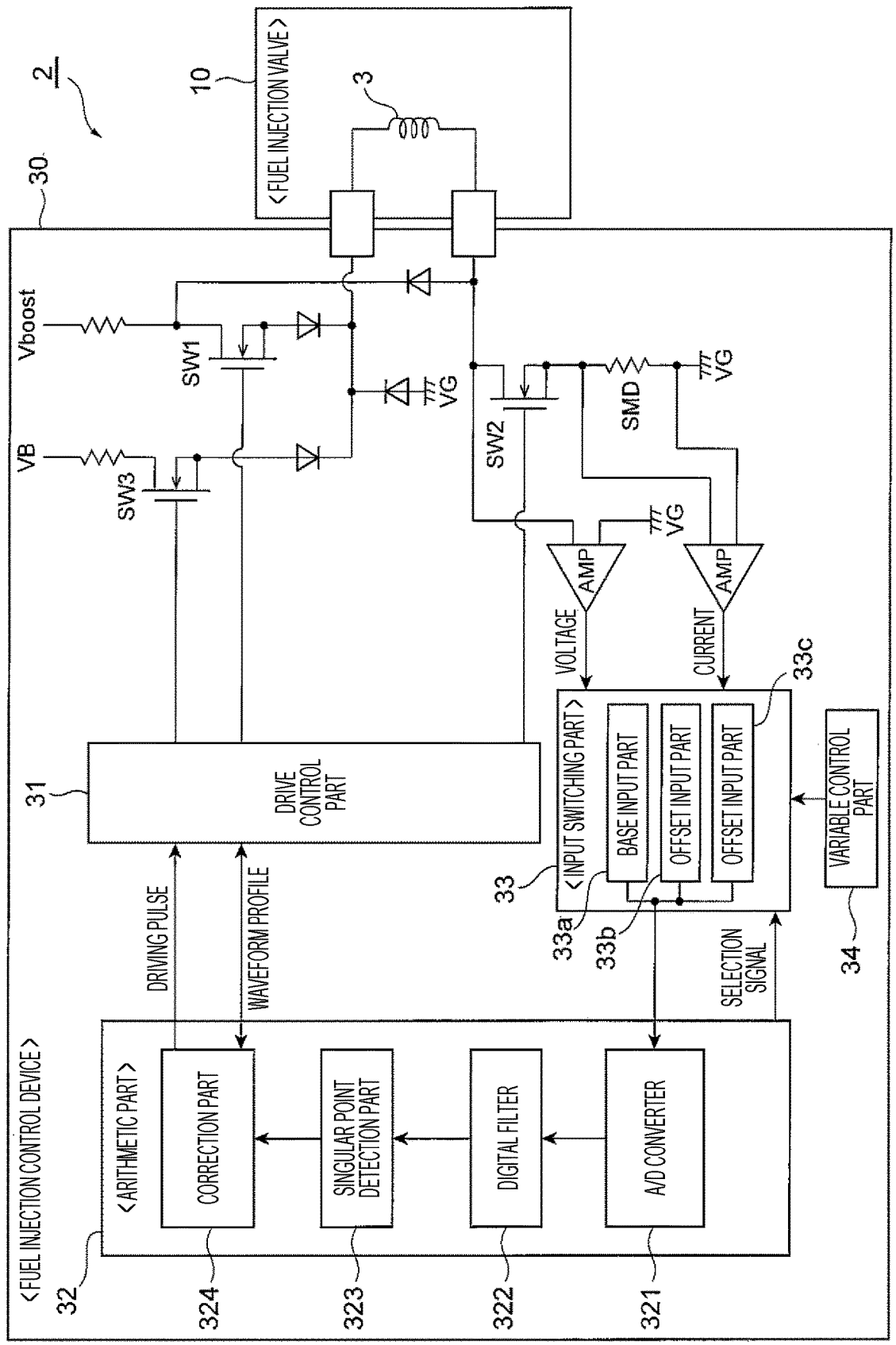
FIG. 5 is an internal configuration diagram showing an internal configuration of a fuel injection control device of a second embodiment according to the present invention.

FIG. 5 shows an internal configuration of a fuel injection control device of a second embodiment according to the present invention, and FIG. 6 specifically describes A/D conversion by an A/D converter shown in FIG. 5.

In the fuel injection control device according to the second embodiment, a method of relatively changing a conversion timing of A/D conversion for the physical quantity data is different from that in the fuel injection control device according to the first embodiment described above. Therefore, in the following, only the differences will be explained in detail, and the same reference numerals are given to the same components as those of the fuel injection control device of the first embodiment to omit the detailed description thereof.

As shown in FIG. 5, in the present embodiment, a variable control part 34 outputs a command signal for relatively changing a conversion timing of the A/D conversion for the physical quantity data, to an input switching part 33.

In addition, the input switching part 33 has: a base input part 33a that inputs the physical quantity data to an A/D converter 321 at a reference input timing synchronized with a peripheral clock of a drive control part 31, the arithmetic part 32, or the like (i.e., synchronized with driving of the fuel injection valve 10); and offset input parts 33b and 33c that input the physical quantity data to the A/D converter 321 at an offset input timing where the reference input timing is shifted (delayed, in the example) by $\Delta t\alpha$ and $\Delta t\beta$ which are shorter times than a predetermined time interval ($\Delta t$) of the A/D conversion by the A/D converter 321, in which the physical quantity data is input to each of the base input part 33a and the offset input parts 33b and 33c.

The input switching part 33 normally inputs the physical quantity data to the A/D converter 321 at the base input part 33a, and the A/D converter 321 starts the A/D conversion on the physical quantity data at the conversion start timing (reference conversion start timing in the first embodiment) synchronized with driving of the fuel injection valve 10. However, when receiving the command signal output from the variable control part 34, the input switching part 33 activates the offset input parts 33b and 33c, and inputs the physical quantity data to the A/D converter 321 at the offset input parts 33b and 33c, in addition to the base input part 33a. As a result, the A/D converter 321 acquires the time series data obtained by sampling each of the physical quantity data input from the base input part 33a (physical quantity data input at the reference input timing synchronized with driving of the fuel injection valve 10), the physical quantity data input from the offset input part 33b (physical quantity data input at the offset input timing shifted by $\Delta t\alpha$ from the reference input timing), and the physical quantity data input from the offset input part 33c (physical quantity data input at the offset input timing shifted by $\Delta t\beta$ from the reference input timing), at the conversion timing (the reference conversion timing in the first embodiment) having the predetermined time interval ($\Delta t$) (see FIG. 6).

The A/D converter 321 outputs the acquired time series data (a plurality of (three types in the illustrated example) time series data having different conversion timings for the physical quantity data) to the singular point detection part 323 via the digital filter 322, and the singular point detection part 323 superimposes (adds) the plurality of time series data to detect a singular point and outputs the detection result to the correction part 324.

Then, the correction part 324 feeds back the detection result output from the singular point detection part 323, to the driving pulse and the waveform profile already obtained, to generate a more appropriate driving pulse and waveform profile. This makes it possible to generate a driving pulse and a waveform profile according to the injection characteristic of each fuel injection valve, and to properly control opening and closing of the fuel injection valve to bring the fuel injection quantity injected from the fuel injection valve close to the target fuel injection quantity.

As described above, in the fuel injection control device 30 of the present embodiment, the variable control part 34 variably controls the input timing of the input switching part 33 such that the conversion timing for the physical quantity data relating to driving of the fuel injection valve 10 is relatively changed, the A/D converter 321 acquires a plurality of time series data by performing A/D conversion on a plurality of physical quantity data input at the input timing before change and at the input timing after change, at the conversion timing set in advance in synchronization with driving of the fuel injection valve 10, and the singular point detection part 323 detects the singular point with respect to the characteristic of the fuel injection valve 10 based on the plurality of time series data. This allows improvement of detection accuracy of the singular point with respect to the characteristic of the fuel injection valve 10 to be equal to or higher than the original time resolution of the A/D conversion, and allows accurate detection of the singular point, enabling reliable suppression of instrumental variations among the fuel injection valves 10 provided in the internal combustion engine.

In the above embodiment, there has been described a configuration where the variable control part 34 variably controls the input timing of the input switching part 33 such that the conversion timing for the physical quantity data during one fuel injection by the fuel injection valve 10 is relatively changed. On the other hand, the variable control part 34 may receive a drive signal of the fuel injection valve 10 (i.e., a signal related to fuel injection by the fuel injection valve 10) from the drive control part 31, to control the input timing of the input switching part 33 such that the conversion timing for the physical quantity data is changed at every fuel injection in response to (in synchronization with) fuel injection by the fuel injection valve 10. That is, the variable control part 34 may output the command signal for sequentially activating one of the base input part 33a and the offset input parts 33b and 33c to the input switching part 33 in response to fuel injection by the fuel injection valve 10, the A/D converter 321 may acquire time series data with a shifted (offset) conversion timing for the physical quantity data at every fuel injection of the fuel injection valve 10, and the singular point detection part 323 may accumulate the time series data and then superimpose the plurality of accumulated time series data to detect the singular point.

Further, in the above-described embodiment, while there are used the driving current and the driving voltage (Low-side voltage) at the time of driving the fuel injection valve 10 as the physical quantity relating to driving of the fuel injection valve 10, needless to say that there may be used, for example, a vibration signal or the like (e.g., a vibration signal generated when the fixed core 11 collides with the movable element 15, a vibration signal generated when the valve element 16 collides with the movable element 15, or the like) obtained from a vibration sensor disposed to or near the fuel injection valve 10.

Note that the present invention is not limited to the above embodiments, and various modifications may be included. For example, the embodiments described above have been illustrated in detail to facilitate description for easy understanding, and are not necessarily limited to the embodiments that include all the configurations. Additionally, a part of a configuration of an embodiment may be replaced with a configuration of another embodiment, and a configuration of an embodiment may be added with a configuration of another embodiment. Moreover, a part of a configuration of each embodiment may be deleted, replaced, added with another configuration.

In addition, control lines and information lines indicate what is considered to be necessary for the description, and all the control lines and information lines are not necessarily always shown on the product. In practice, it can be considered that almost all the structures are mutually connected.

REFERENCE SIGNS LIST

1, 2 fuel injection device
10 fuel injection valve
20, 30 fuel injection control device
21, 31 drive control part
22, 32 arithmetic part
23, 33 input switching part (input part)
24, 34 variable control part
221, 321 A/D converter (A/D conversion part)
222, 322 digital filter
223, 323 singular point detection part (detection part)
224, 324 correction part

The invention claimed is:

1. A fuel injection control device that controls behavior of a fuel injection valve by detecting an injection characteristic of the fuel injection valve from physical quantity data relating to driving of the fuel injection valve, the fuel injection control device comprising:
an input part to input the physical quantity data at a reference input timing synchronized with a clock of the control device, the physical quantity data including a driving current and a driving voltage;
a microcomputer comprising:
an A/D conversion part configured to perform A/D conversion at a first resolution on the physical quantity data at a reference conversion timing having a predetermined time interval to acquire a set of time series data at the first resolution,
wherein, responsive to receiving an instruction from the microcomputer, the input part is configured to select one of the driving current or the driving voltage as the physical quantity data to input to the A/D conversion part based on the instruction; and
a detection part configured to detect a singular point with respect to a characteristic of the fuel injection valve from the set of time series data;
a drive control part configured to cause a boosted voltage to be generated based on information from the microcomputer and control the driving voltage applied and the driving current supplied to a solenoid of the fuel injection valve; and
a variable control part configured to variably control an input timing of the input part or a conversion timing of the A/D conversion part such that the conversion timing for the physical quantity data is shifted,
wherein the A/D conversion part is configured to acquire a plurality of sets of time series data, wherein acquiring the plurality of sets of time series data comprises performing, at the conversion timing, A/D conversion on a plurality of physical quantity data input at an input timing before shifting from the reference input timing and an input timing after shifting from the reference input timing by the variable control part, or performing A/D conversion on the physical quantity data at a conversion timing before shifting from the reference conversion timing and at a conversion timing after shifting from the reference conversion timing by the variable control part,
wherein shifting from the reference input timing or the reference conversion timing generates sets of time series data having conversion timings shifted in time from the predetermined time interval, and
wherein the detection part is configured to detect the singular point based on the plurality of sets of time series data by superimposing the plurality of sets of time series data to obtain the physical quantity data at a second resolution higher than the first resolution.

2. The fuel injection control device according to claim 1, wherein the A/D conversion part is provided with a base conversion part configured to perform A/D conversion at a conversion timing before shifting, and at least one offset conversion part configured to perform A/D conversion at a conversion timing after shifting by the variable control part, and provided with a plurality of channels to input the physical quantity data to each of the base conversion part and the at least one offset conversion part.

3. The fuel injection control device according to claim 1, wherein the input part is provided with a base input part to input physical quantity data to the A/D conversion part at an input timing before shifting, and at least one offset input part that inputs physical quantity data to the A/D conversion part at an input timing after shifting by the variable control part.

4. The fuel injection control device according to claim 1, wherein the variable control part is configured to variably control an input timing of the input part or a conversion timing of the A/D conversion part such that the conversion timing for the physical quantity data during one fuel injection by the fuel injection valve is shifted.

5. The fuel injection control device according to claim 1, wherein the variable control part is configured to variably control an input timing of the input part or a conversion timing of the A/D conversion part such that the conversion timing for the physical quantity data is shifted at every fuel injection by the fuel injection valve.

6. The fuel injection control device according to claim 2, wherein:
- the at least one offset conversion part comprises a first offset conversion part and a second offset conversion part;
- the first offset conversion part has a first offset amount at the conversion timing of the A/D conversion of the first offset conversion part with respect to the conversion timing of the A/D conversion of the base conversion part;
- the second offset conversion part has a second offset amount at the conversion timing of the A/D conversion of the second offset conversion part with respect to the conversion timing of the A/D conversion of the base conversion part; and
- the second offset amount, the first offset amount and the predetermined time interval satisfy a relationship of $\Delta t\alpha < \Delta t\beta < \Delta t$, where $\Delta t\alpha$ is the first offset amount, $\Delta t\beta$ is the second offset amount, and $\Delta t$ is the predetermined time interval.

7. The fuel injection control device of claim 6, wherein the variable control part is configured to output a command signal to the A/D conversion part to sequentially activate one of the base conversion part, the first offset conversion part, and the second offset conversion part.

* * * * *